(12) United States Patent
Chen et al.

(10) Patent No.: US 10,134,683 B2
(45) Date of Patent: Nov. 20, 2018

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Tien-Szu Chen, Kaohsiung (TW); Kuang-Hsiung Chen, Kaohsiung (TW); Sheng-Ming Wang, Kaohsiung (TW); I-Cheng Wang, Kaohsiung (TW); Wun-Jheng Syu, Kaohsiung (TW); Yu-Tzu Peng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/430,355

(22) Filed: Feb. 10, 2017

(65) Prior Publication Data

US 2018/0233457 A1     Aug. 16, 2018

(51) Int. Cl.
*H01L 23/552* (2006.01)
*H01L 23/31* (2006.01)
(Continued)

(52) U.S. Cl.
CPC .......... *H01L 23/552* (2013.01); *H01L 21/565* (2013.01); *H01L 21/568* (2013.01);
(Continued)

(58) Field of Classification Search
CPC . H01L 23/552; H01L 21/565; H01L 25/0657; H01L 21/76885; H01L 25/50; H01L 21/568; H01L 21/6835; H01L 21/76895; H01L 25/105; H01L 23/5389; H01L 23/5385; H01L 23/5384; H01L 25/0655; H01L 23/295; H01L 23/3675; H01L 23/3107; H01L 2225/1094;
(Continued)

(56) References Cited

U.S. PATENT DOCUMENTS 5,977,626 A * 11/1999 Wang ................... H01L 23/3128
                                                      257/691
6,972,964 B2 * 12/2005 Ho ....................... H01L 23/5389
                                                      257/E23.178
(Continued)

*Primary Examiner* — David Vu
(74) *Attorney, Agent, or Firm* — Foley & Lardner LLP; Cliff Z. Liu

(57) ABSTRACT

A semiconductor device package includes a first circuit layer having a first surface and a second surface opposite the first side, a first electronic component, a shielding element, a shielding layer and a molding layer. The first electronic component is disposed over the first surface of the first circuit layer, and electrically connected to the first circuit layer. The shielding element is disposed over the first surface of the first circuit layer, and is electrically connected to the first circuit layer. The shielding element is disposed adjacent to at least one side of the first electronic component. The shielding layer is disposed over the first electronic component and the shielding element, and the shielding layer is electrically connected to the shielding element. The molding layer encapsulates the first electronic component, the shielding element and a portion of the shielding layer.

21 Claims, 27 Drawing Sheets

(51) Int. Cl.
    *H01L 23/367*     (2006.01)
    *H01L 23/29*     (2006.01)
    *H01L 25/065*     (2006.01)
    *H01L 23/538*     (2006.01)
    *H01L 21/56*     (2006.01)
    *H01L 21/768*     (2006.01)
    *H01L 21/683*     (2006.01)
    *H01L 25/00*     (2006.01)
    *H01L 25/10*     (2006.01)

(52) U.S. Cl.
    CPC .... *H01L 21/6835* (2013.01); *H01L 21/76885* (2013.01); *H01L 21/76895* (2013.01); *H01L 23/295* (2013.01); *H01L 23/3107* (2013.01); *H01L 23/3675* (2013.01); *H01L 23/5384* (2013.01); *H01L 23/5385* (2013.01); *H01L 23/5389* (2013.01); *H01L 25/0655* (2013.01); *H01L 25/0657* (2013.01); *H01L 25/105* (2013.01); *H01L 25/50* (2013.01); *H01L 2221/68359* (2013.01); *H01L 2225/06548* (2013.01); *H01L 2225/06562* (2013.01); *H01L 2225/06589* (2013.01); *H01L 2225/1058* (2013.01); *H01L 2225/1094* (2013.01)

(58) Field of Classification Search
    CPC . H01L 2225/06589; H01L 2225/06562; H01L 2225/06548; H01L 2221/68359; H01L 2225/1058
    See application file for complete search history.

(56) References Cited

U.S. PATENT DOCUMENTS

| | | |
|---|---|---|
| 8,258,012 B2 | 9/2012 | Pagaila et al. |
| 9,355,939 B2 | 5/2016 | Cho et al. |
| 2011/0018114 A1* | 1/2011 | Pagaila ............ H01L 21/561 257/686 |
| 2016/0073496 A1 | 3/2016 | Vincent |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package with good shielding and heat dissipation capabilities and a method of manufacturing the same.

2. Description of the Related Art

A semiconductor device package may include an electronic device operating at a particular frequency, such as a radio frequency integrated circuit (RFIC), which may generate electromagnetic interference (EMI). The EMI can become particularly problematic when a layout density of components of the semiconductor device package increases and when the semiconductor device package becomes miniaturized. In addition, heat dissipation of a semiconductor device package is another issue of concern.

SUMMARY

In some embodiments, according to one aspect, a semiconductor device package includes a first circuit layer having a first surface and a second surface opposite the first surface, a first electronic component, a shielding element, a shielding layer and a molding layer. The first electronic component is disposed over the first surface of the first circuit layer, and is electrically connected to the first circuit layer. The shielding element is disposed over the first surface of the first circuit layer, and is electrically connected to the first circuit layer. The shielding element is disposed adjacent to at least one side of the first electronic component. The shielding layer is disposed over the first electronic component and the shielding element, and the shielding layer is electrically connected to the shielding element. The molding layer encapsulates the first electronic component, the shielding element and a portion of the shielding layer. An upper surface of the molding layer and an upper surface of the shielding layer are substantially coplanar.

In some embodiments, according to another aspect, a semiconductor device package includes a circuit layer having a first surface and a second surface opposite the first surface, a first electronic component, a second electronic component, a shielding element, a molding layer and a shielding layer. The first electronic component is disposed over the first surface of the circuit layer. The first electronic component includes a plurality of first conductive pillars extending toward the first surface and electrically connected to the circuit layer. The second electronic component is disposed over the first surface of the circuit layer and the first electronic component. The second electronic component includes a plurality of second conductive pillars extending toward the first surface and electrically connected to the circuit layer, the second electronic component partially overlapping the first electronic component, a length of at least one of the second conductive pillars being larger than a length of at least one of the first conductive pillars. The shielding element is disposed over the first surface and is electrically connected to the circuit layer, and the shielding element is disposed adjacent to at least one side of the first electronic component and to at least one side of the second electronic component. The molding layer encapsulates the first electronic component, the second electronic component and the shielding element. The shielding layer is disposed over the molding layer and is electrically connected to the shielding element. The carrier is disposed over the shielding layer.

In some embodiments, according to another aspect, a method of manufacturing a semiconductor device package includes forming a shielding layer over a carrier; forming a shielding element over the shielding layer; disposing a first electronic component over the shielding layer; disposing a molding layer to encapsulate the shielding layer, the shielding element and the first electronic component; and forming a first circuit layer over the molding layer, the shielding element and the first electronic component.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
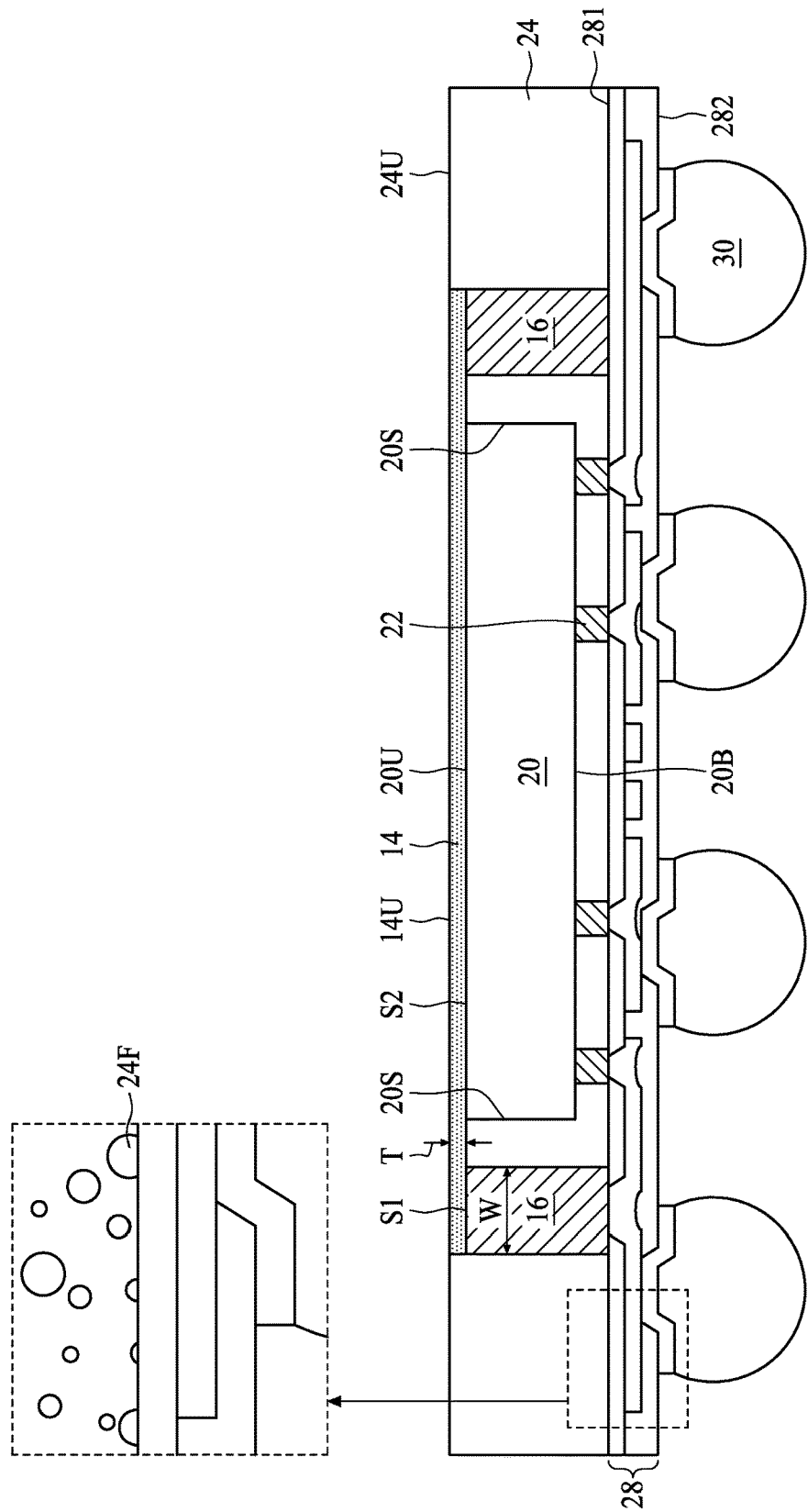
FIG. 1 is a cross-sectional view of a semiconductor device package in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters to refer to components of the various examples. This repetition is for the purpose of simplicity and clarity and does necessarily imply that components referred to by a same reference numeral and/or letter are identical. For example, some such components may be similar in some respects, but may differ in other respects.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description is directed to a semiconductor device package. In some embodiments, the semiconductor device package includes a shielding element disposed over a circuit layer and disposed adjacent to at least one side of an electronic component, and a shielding layer disposed over the electronic component and electrically connected to the shielding element. The shielding layer and the shielding element are configured to function as an EMI shield and a heat sink for the electronic component, and provide a ground path. The following description is also directed to a method of manufacturing a semiconductor device package, as discussed below.

FIG. 1 is a cross-sectional view of a semiconductor device package 1 in accordance with some embodiments of the present disclosure. As shown in FIG. 1, the semiconductor device package 1 includes a first circuit layer 28, a first electronic component 20, a shielding element 16, a shielding layer 14 and a molding layer 24. The first circuit layer 28 includes a first surface 281 facing the first electronic component 20, and a second surface 282 opposite to the first surface 281. In some embodiments, the first circuit layer 28 includes a redistribution layer (RDL) configured to reroute input/output paths corresponding to input/output (I/O) contacts of the first electronic component 20. In some embodiments, the first circuit layer 28 includes one or more conductive wiring layers and one or more dielectric layers, which may be stacked adjacent to or on each other. In some embodiments, a conductive wiring layer proximal to the second surface 282 may function as or may include bonding pads such as under bump metallurgies (UBMs).

The first electronic component 20 is disposed over a first surface 281 of the first circuit layer 28, and is electrically connected to the first circuit layer 28. In some embodiments, the first electronic component 20 includes a semiconductor die having an integrated circuit (IC) formed therein. In some embodiments, the first electronic component 20 includes, but is not limited to, an active component such as an application specific IC (ASIC), a memory component such as a high bandwidth memory (HBM) component or another active component, and/or a passive component such as a capacitor, an inductor, a resistor or the like. In some embodiments, conductive pillars 22 such as metal pillars are disposed under a bottom surface 20B of the first electronic component 20, and the first electronic component 20 is electrically connected to the first circuit layer 28 through the conductive pillars 22. By way of example, the conductive pillars 22 include, but are not limited to, copper pillars.

The shielding element 16 is disposed over the first surface 281 of the first circuit layer 28, and is electrically connected to the first circuit layer 28. The shielding element 16 is disposed adjacent to at least one side 20S of the first electronic component 20. By way of example, the shielding element 16 may be disposed adjacent to one side 20S, two sides 20S, three sides 20S or more sides 20S of the first electronic component 20. In some embodiments, the shielding element 16 surrounds the sides 20S of the first electronic component 20 to shield the first electronic component 20 from EMI. In some embodiments, the shielding element 16 is configured to function as a part of a grounding path. In some embodiments, the shielding element 16 is formed of conductive material such as metal or metal alloy. By way of example, the conductive material may include, but is not limited to, copper, copper alloy, or the like.

The shielding layer 14 is disposed over the first electronic component 20 and the shielding element 16. In some embodiments, the shielding layer 14 is formed of conductive material such as metal or alloy. By way of example, the conductive material may include, but is not limited to, copper, copper alloy, or the like. In some embodiments, the shielding layer 14 is a conformal shielding, covering an upper surface 20U of the first electronic component 20 to provide an EMI shielding effect. In some embodiments, the shielding layer 14 is configured to function as another part of a grounding path. In some embodiments, the shielding layer 14 is electrically connected to the shielding element 16, forming an EMI shielding cap enclosing the upper surface 20U and the sides 20S of the first electronic component 20. In some embodiments, the shielding layer 14 is in contact with the first electronic component 20, and configured to provide a heat dissipation path for the first electronic component 20. In some embodiments, a width W (e.g. a horizontal extension, as shown in FIG. 1) of the shielding element 16 is larger than a thickness T (e.g. a vertical extension, as shown in FIG. 1) of the shielding layer 14. The width W of the shielding element 16 and the thickness T of the shielding layer 14 may be modified as appropriate based on desired shielding effect, heat dissipation effect or other considerations.

The molding layer 24 encapsulates the first electronic component 20, the shielding element 16 and a portion of the shielding layer 14. In some embodiments, an upper surface 24U of the molding layer 24 and an upper surface 14U of the shielding layer 14 are substantially coplanar. In some embodiments, the material of the molding layer 24 includes, but is not limited to, a molding compound such as an epoxy resin or the like, and fillers 24F such as silicon oxide fillers in the molding compound. In some embodiments, the fillers 24F disposed adjacent to the first circuit layer 28 have at least one cutting plane. In some embodiments, a first interface S1 between the shielding layer 14 and the shielding element 16 and a second interface S2 between the shielding layer 14 and the first electronic component 20 are substantially coplanar.

In some embodiments, the semiconductor device package 1 further includes first conductors 30 disposed over the second surface 282 of the first circuit layer 28, and electrically connected to the first circuit layer 28. In some embodiments, the first conductors 30 include conductive bumps such as solder bumps, solder balls, solder pastes or the like. In some embodiments, at least some of the first conductors 30 are electrically connected to the first electronic component 20 through the first circuit layer 28, and are configured to provide an electrical connection path to another electronic device such as a circuit board or the like. In some embodiments, some other first conductors 30 are electrically connected to the shielding element 16 through the first circuit layer 28, and are configured to connect to a grounding circuit.

Figure 2A:
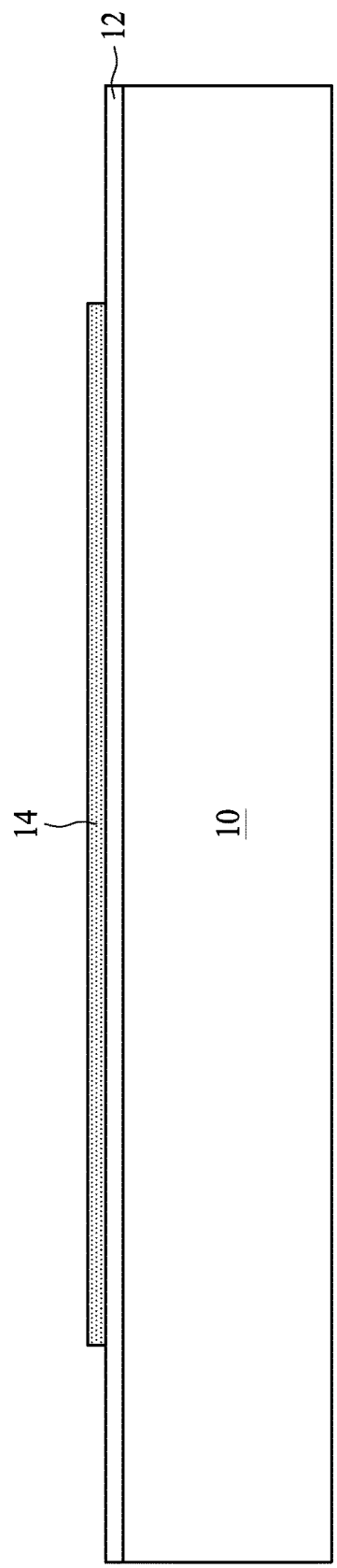
FIG. 2A, FIG. 2B, FIG. 2C, FIG. 2D, FIG. 2E, FIG. 2F and FIG. 2G illustrate an example of a manufacturing method of a semiconductor device package in accordance with some embodiments of the present disclosure.

FIG. 2A, FIG. 2B, FIG. 2C, FIG. 2D, FIG. 2E, FIG. 2F and FIG. 2G illustrate an example of a manufacturing method of the semiconductor device package 1 in accordance with some embodiments of the present disclosure. As depicted in FIG. 2A, a shielding layer 14 is formed over a carrier 10. In some embodiments, a conductive film 12 configured to function as a seed layer is formed over the carrier 10 prior to formation of the shielding layer 14. In some embodiments, the conductive film 12 is a metal film such as a copper film or an alloy film such as a titanium/copper (Ti/Cu) film, which can be formed by pasting, sputtering or any other suitable technique. In some embodiments, the shielding layer 14 may, but need not, be formed by plating.

Figure 2B:
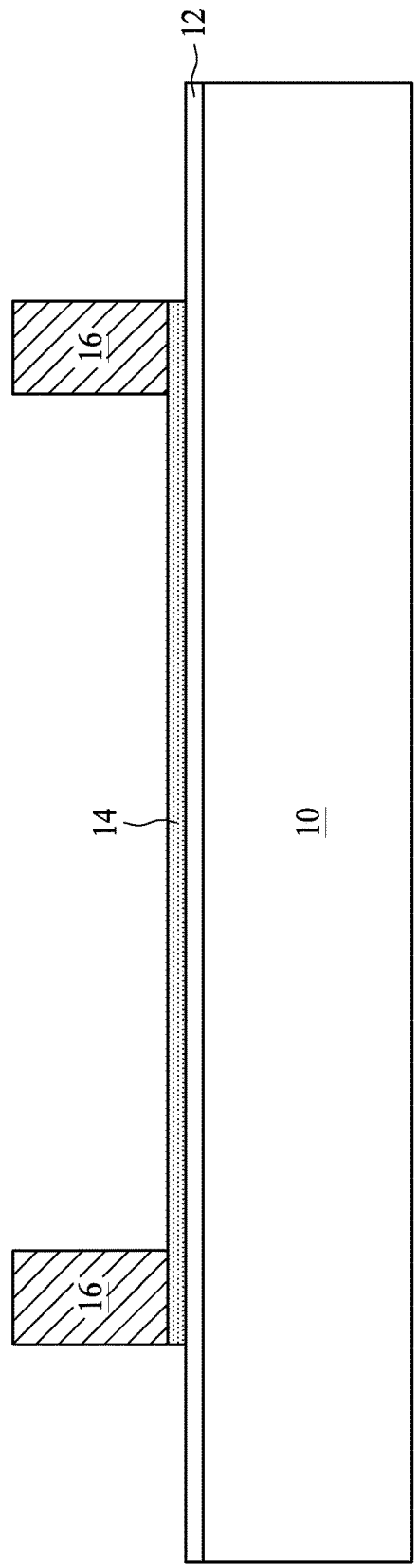
Figure 2C:
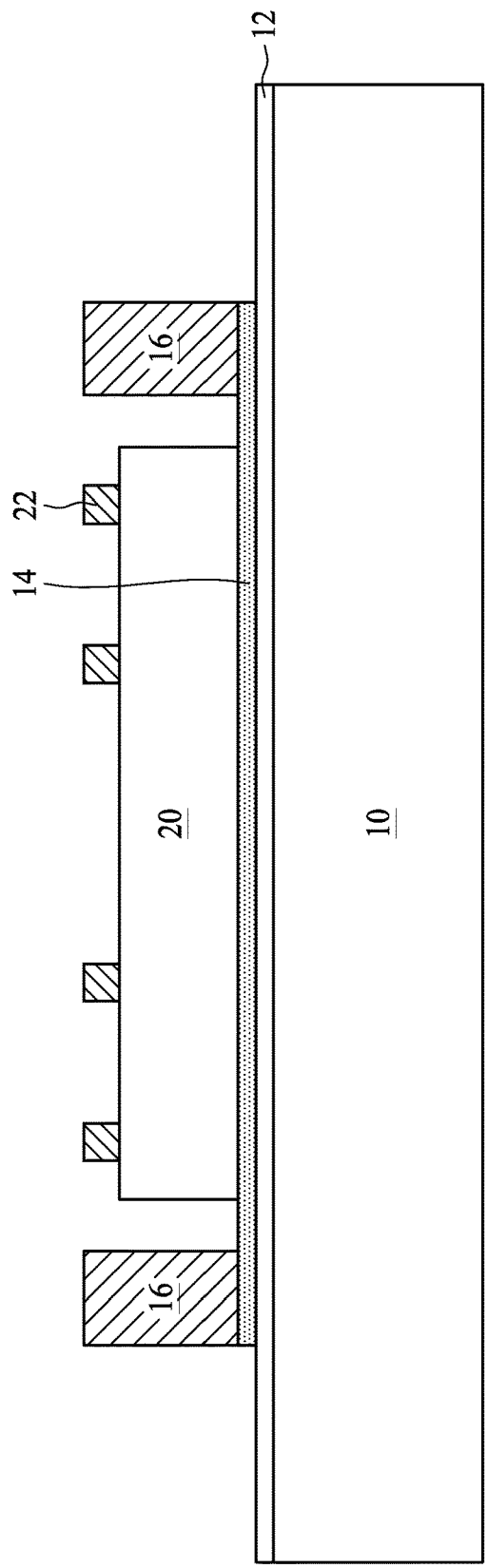

As shown in FIG. 2B, a shielding element 16 is formed over the shielding layer 14. In some embodiments, the shielding element 16 may, but need not, be formed by plating. As shown in FIG. 2C, a first electronic component 20 is bonded to the carrier 10 (e.g. via the shielding layer 14 and/or the conductive film 12), and is disposed adjacent to the shielding element 16. In some embodiments, the first electronic component 20 includes conductive pillars 22 such as conductive posts extending upward.

Figure 2D:
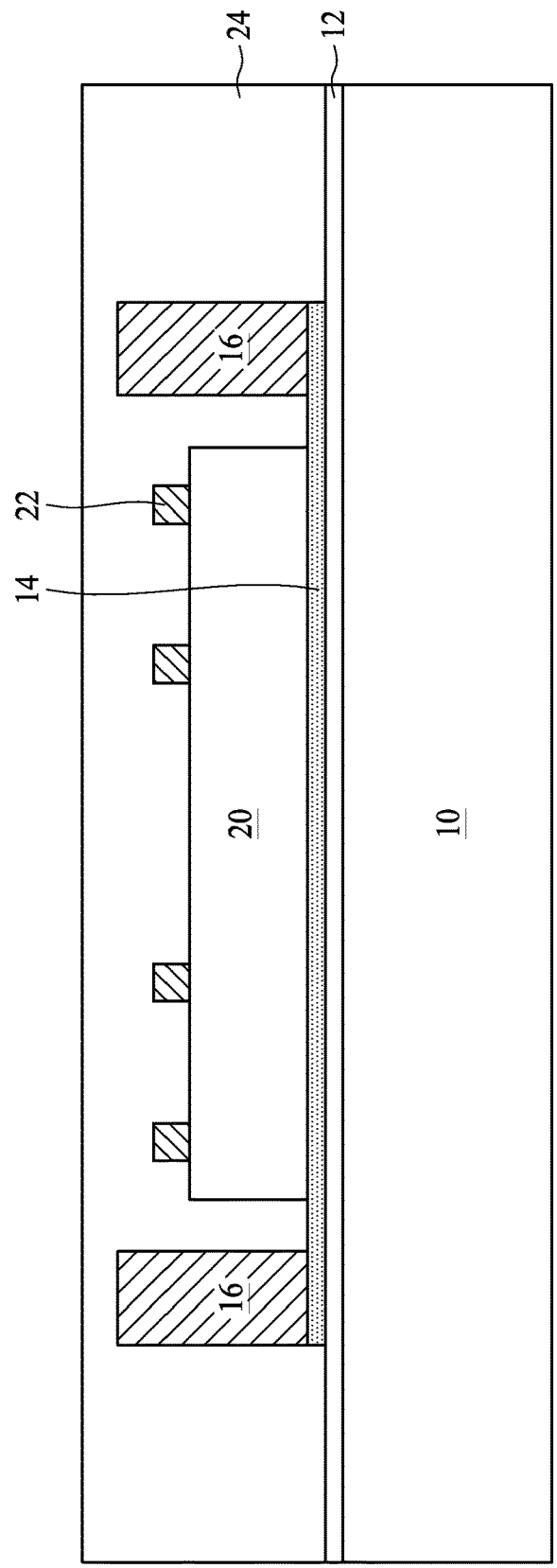
Figure 2E:
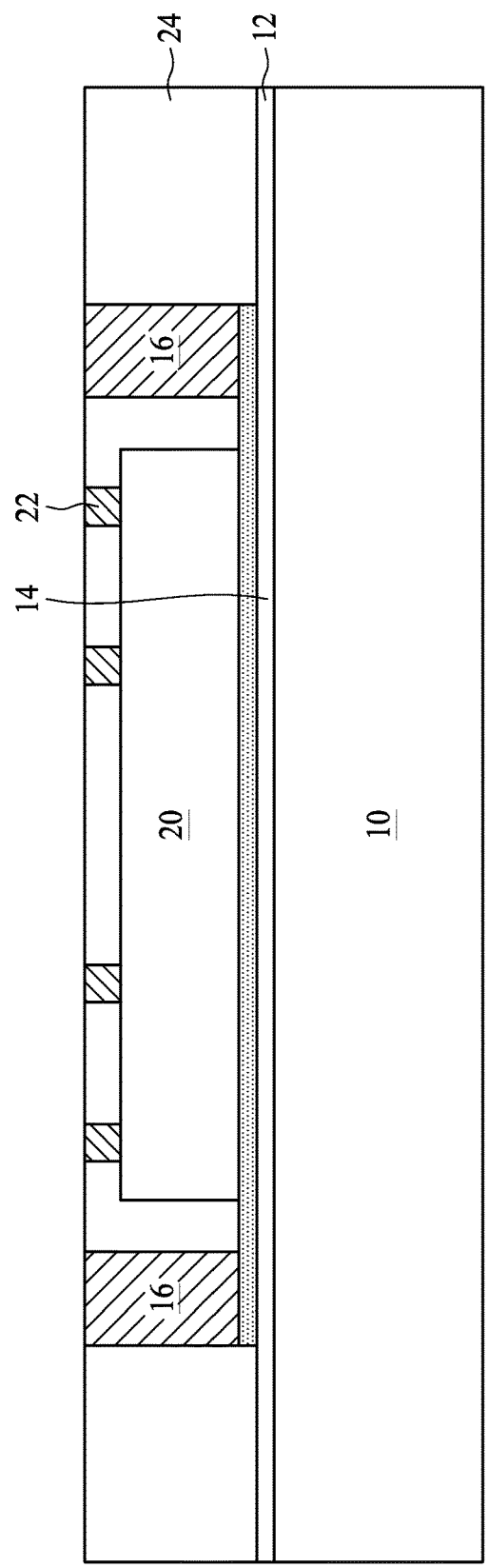

As shown in FIG. 2D, a molding layer 24 is disposed over the carrier 10 to encapsulate the shielding layer 14, the shielding element 16 and the first electronic component 20. As shown in FIG. 2E, a portion of the molding layer 24 is removed to expose the shielding element 16. In some embodiments, the portion of the molding layer 24 is removed by grinding. In some embodiments, the conductive pillars 22 of the first electronic component 20 are exposed after grinding.

Figure 2F:
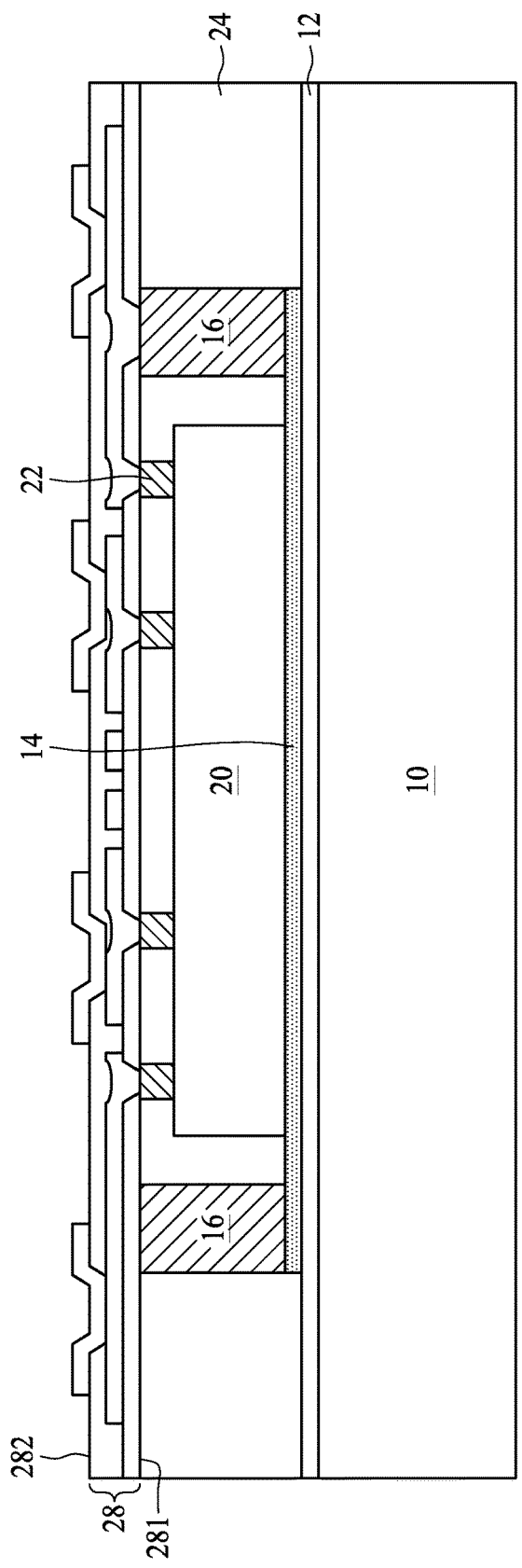
Figure 2G:
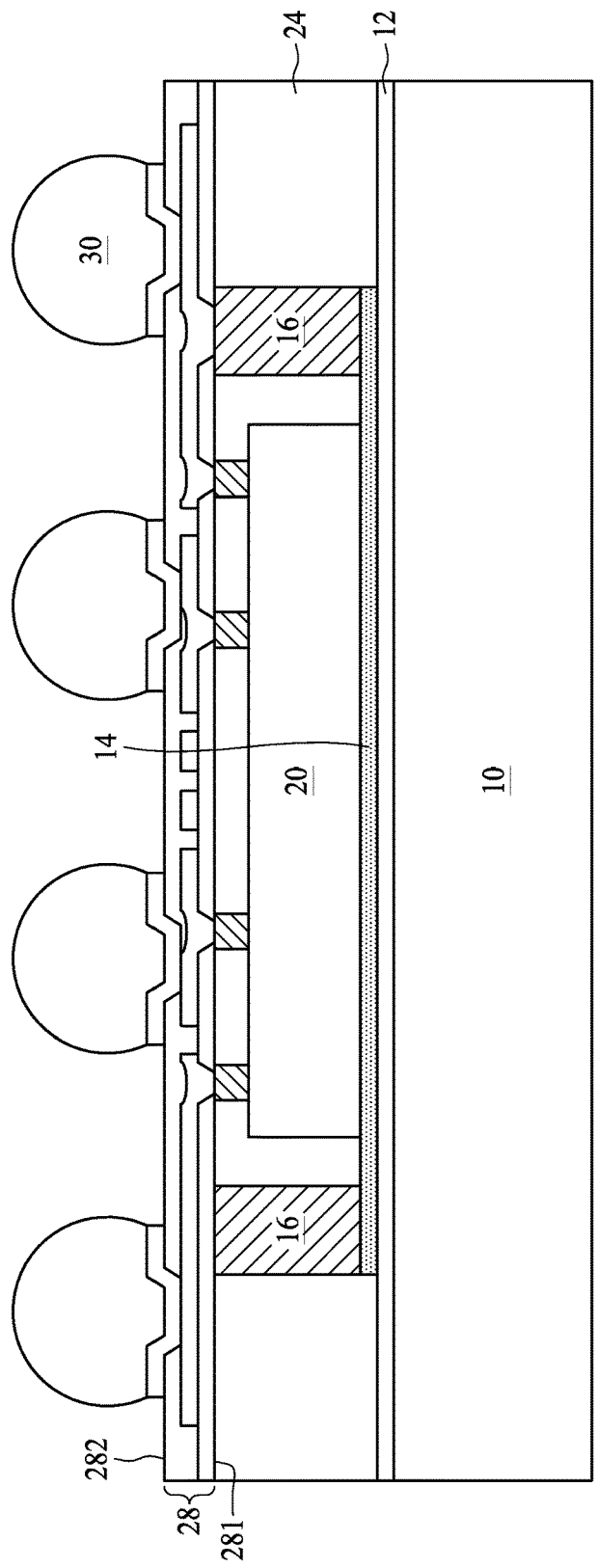

As shown in FIG. 2F, a first circuit layer 28 is formed over the molding layer 24, the shielding element 16, the conductive pillars 22 and the first electronic component 20. In some embodiments, the first circuit layer 28 is an RDL implemented by alternately forming several conductive wiring layers and several dielectric layers. The first circuit layer 28 includes a first surface 281 facing the first electronic component 20, and a second surface 282 opposite to the first surface 281. In some embodiments, a conductive wiring layer proximal to the second surface 282 may function as or may include bonding pads such as under bump metallurgies (UBMs). As shown in FIG. 2G, first conductors 30 are formed over the second surface 282 of the first circuit layer 28. The carrier 10 and the conductive film 12 are removed from the shielding layer 14, and a singulation process is performed to form a semiconductor device package 1 as illustrated in FIG. 1.

The semiconductor device package and manufacturing method of the present disclosure are not limited to the above-mentioned embodiments, and may be implemented according to other embodiments. To streamline the description and for the convenience of comparison between various embodiments of the present disclosure, similar components in each of the following embodiments are marked with same numerals, and are not redundantly described.

Figure 3:
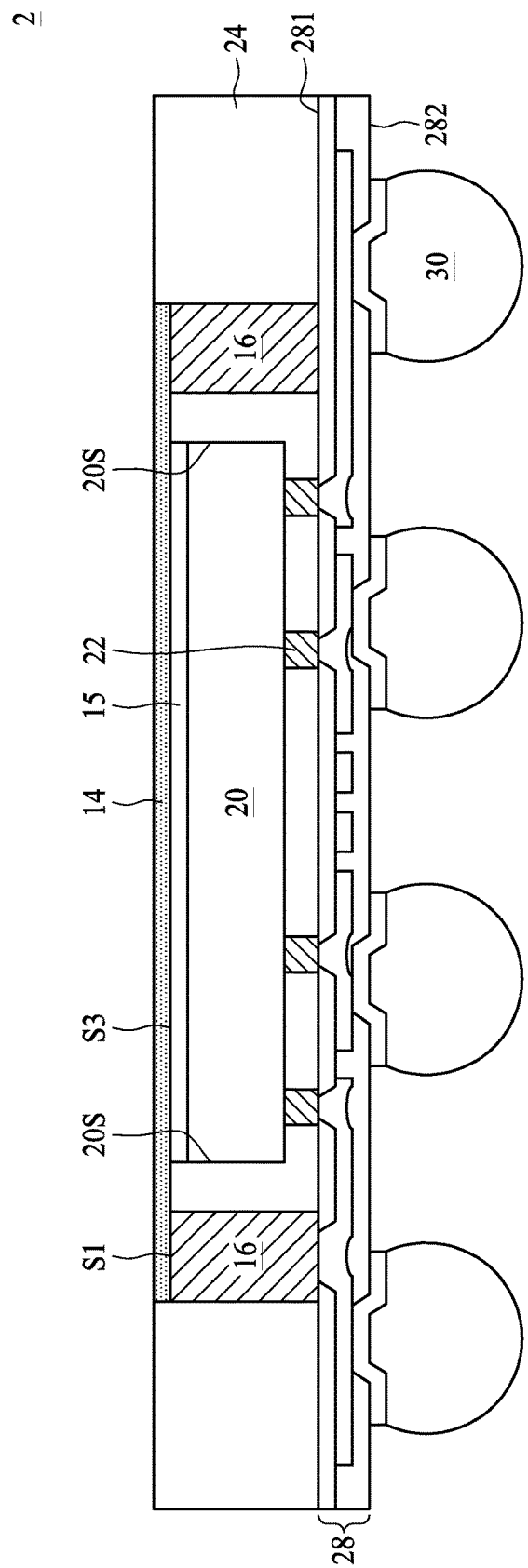
FIG. 3 is a cross-sectional view of a semiconductor device package in accordance with some embodiments of the present disclosure.

FIG. 3 is a cross-sectional view of a semiconductor device package 2 in accordance with some embodiments of the present disclosure. As shown in FIG. 3, different from the semiconductor device package 1, the semiconductor device package 2 further includes a thermal conductive element 15 between the first electronic component 20 and the shielding layer 14. The thermal conductive element 15 is formed from a thermal conductive material, and is configured to function as a heat sink for enhancing heat dissipation of the first electronic component 20. In some embodiments, a first interface S1 between the shielding layer 14 and the shielding element 16 and a third interface S3 between the shielding layer 14 and the thermal conductive element 15 are substantially coplanar.

Figure 4:
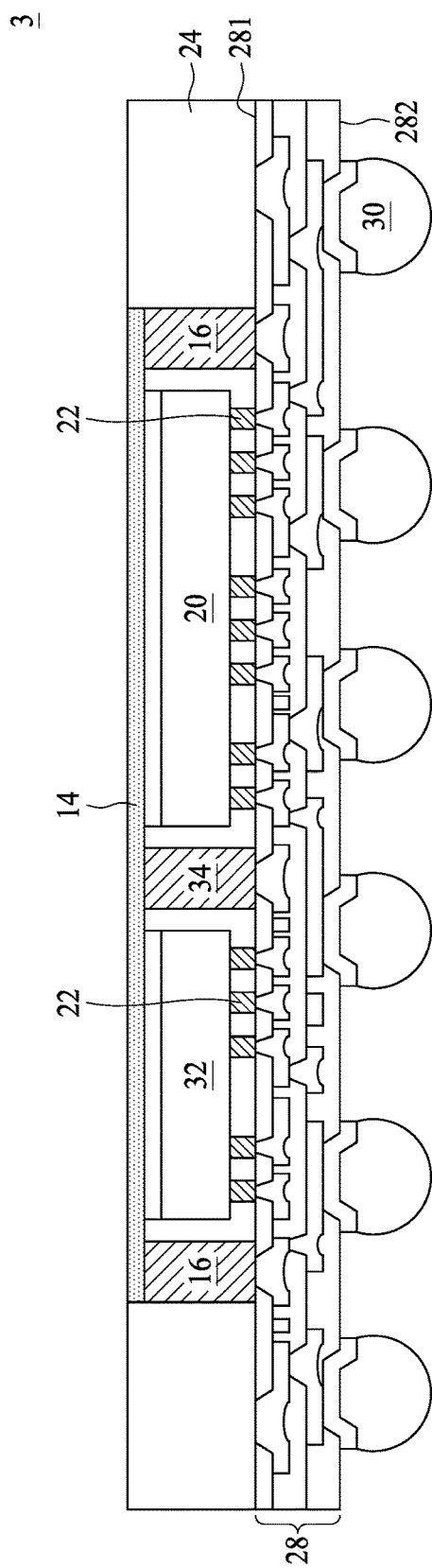
FIG. 4 is a cross-sectional view of a semiconductor device package in accordance with some embodiments of the present disclosure.

FIG. 4 is a cross-sectional view of a semiconductor device package 3 in accordance with some embodiments of the present disclosure. As shown in FIG. 4, different from the semiconductor device package 1, the semiconductor device package 3 further includes a second electronic component 32 and a shielding compartment 34 (which may be, for example, a conductive post or pillar, such as a metallic conductive post or pillar). The second electronic component 32 is disposed over the first surface 281 of the first circuit layer 28, and is electrically connected to the first circuit layer 28. In some embodiments, the second electronic component 32 is disposed adjacent to the first electronic component 20. The shielding compartment 34 is disposed over the first surface 281 of the first circuit layer 28 and between the first electronic component 20 and the second electronic component 32. In some embodiments, the shielding compartment 34 is electrically connected to the first circuit layer 28 and the shielding layer 14. The shielding compartment 34 is configured to block EMI transmission between the first electronic component 20 and the second electronic component 32. In some embodiments, the shielding layer 14 is in contact with the first electronic component 20 and the second electronic component 32. In some alternative embodiments, conductive elements 15 may be disposed between the first electronic component 20 and the shielding layer 14, and/or between the second electronic component 32 and the shielding layer 14.

Figure 5:
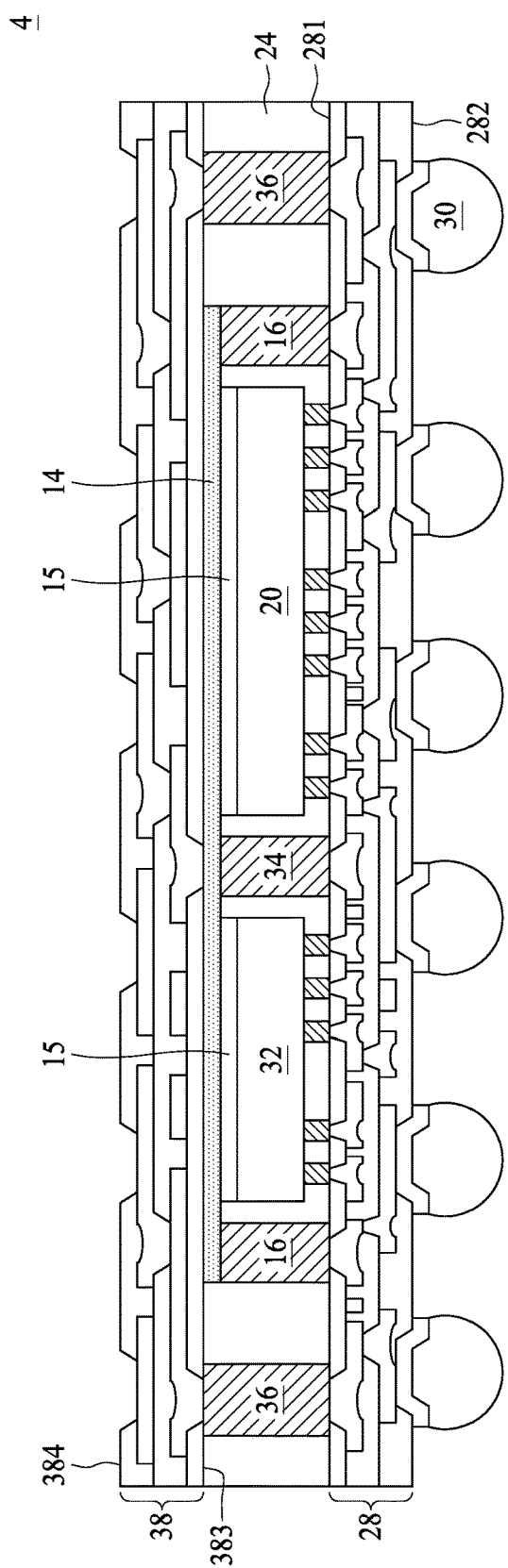
FIG. 5 is a cross-sectional view of a semiconductor device package in accordance with some embodiments of the present disclosure.

FIG. 5 is a cross-sectional view of a semiconductor device package 4 in accordance with some embodiments of the present disclosure. As shown in FIG. 5, different from the semiconductor device package 3, the semiconductor device package 4 further includes at least one conductive post 36 and a second circuit layer 38. The at least one conductive post 36 penetrates through the molding layer 24 and is electrically connected to the first circuit layer 28. In some embodiments, the at least one conductive post 36 is configured to electrically connect the first circuit layer 28 and the second circuit layer 38. In some embodiments, the at least one conductive post 36 may be, but is not limited to, a metal post such as a copper post. The second circuit layer 38 is disposed over the molding layer 24, the shielding layer 14 and the at least one conductive post 36, and is electrically connected to the shielding layer 14 and the at least one conductive post 36. The second circuit layer 38 includes a third surface 383 facing the first circuit layer 28, and a fourth surface 384 opposite to the third surface 383. In some embodiments, the second circuit layer 38 is a redistribution layer (RDL) configured to reroute input/output paths corresponding to input/output (I/O) contacts of the first electronic component 20 and/or the second electronic component 32. In some embodiments, the second circuit layer 38 includes one or more conductive wiring layers and one or more dielectric layers stacked on each other. In some embodiments, a conductive wiring layer proximal to the fourth surface 384 may function as or may include bonding pads such as under bump metallurgies (UBMs).

Figure 6A:
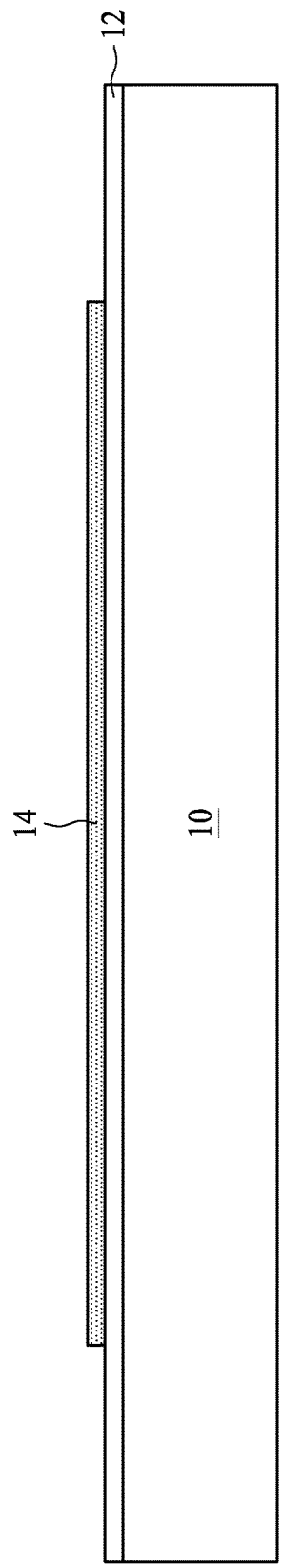
FIG. 6A, FIG. 6B, FIG. 6C, FIG. 6D, FIG. 6E, FIG. 6F, FIG. 6G and FIG. 6H illustrate an example of a manufacturing method of a semiconductor device package in accordance with some embodiments of the present disclosure.

FIG. 6A, FIG. 6B, FIG. 6C, FIG. 6D, FIG. 6E, FIG. 6F, FIG. 6G and FIG. 6H illustrate an example of a manufacturing method of the semiconductor device package 4 in accordance with some embodiments of the present disclosure. As depicted in FIG. 6A, a shielding layer 14 is formed over a carrier 10. In some embodiments, a conductive film 12 configured to function as a seed layer is formed over the carrier 10 prior to formation of the shielding layer 14. In some embodiments, the conductive film 12 is a metal film such as a copper film or an alloy film such as a titanium/copper (Ti/Cu) film, which can be formed by pasting, sputtering or any other suitable technique. In some embodiments, the shielding layer 14 may, but need not, be formed by plating.

Figure 6B:
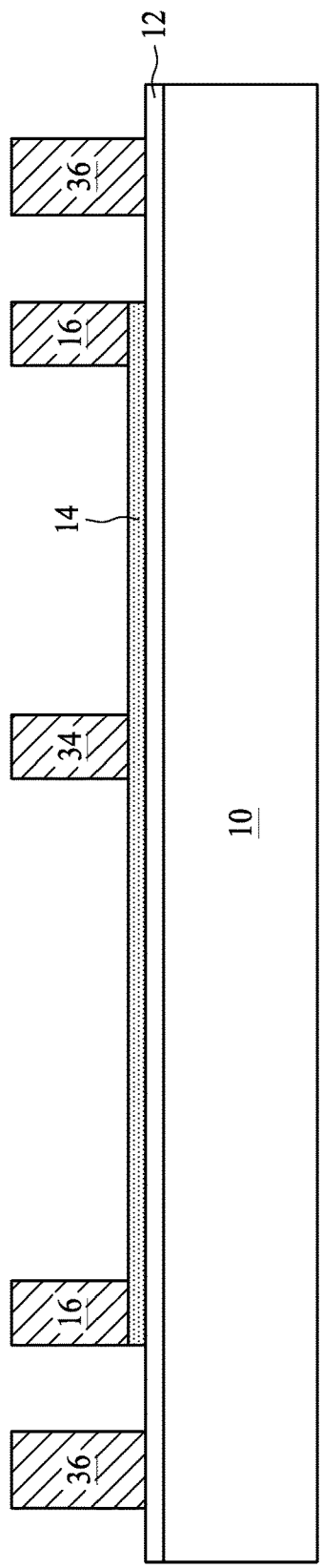
Figure 6C:
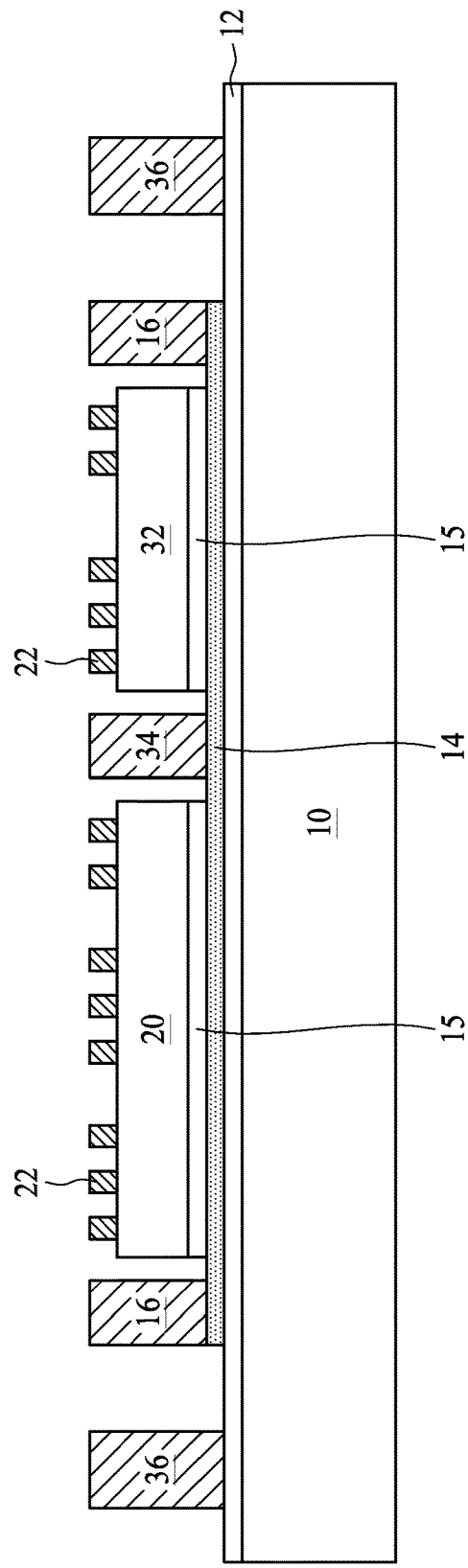

As shown in FIG. 6B, a shielding element 16 is formed over the shielding layer 14. In some embodiments, the shielding element 16 may, but need not, be formed by plating. At least one conductive post 36 is formed over the carrier 10 (e.g. over the conductive film 12). In some embodiments, the at least one conductive post 36 and the shielding element 16 are formed concurrently by the same process such as plating. In some embodiments, a shielding compartment 34 may be formed over the shielding layer 14 at this stage. As shown in FIG. 6C, a first electronic component 20 and a second electronic component 32 are bonded to the carrier 10 (e.g. via the conductive film 12 and the shielding layer 14). In some embodiments, the first electronic component 20 and the second electronic component 32 include conductive pillars 22 such as conductive posts extending upward. In some embodiments, a thermal conductive element 15 is formed between at least one of: (i) the first electronic component 20 and the shielding layer 14, and (ii) the second electronic component 32 and the shielding layer 14.

Figure 6D:
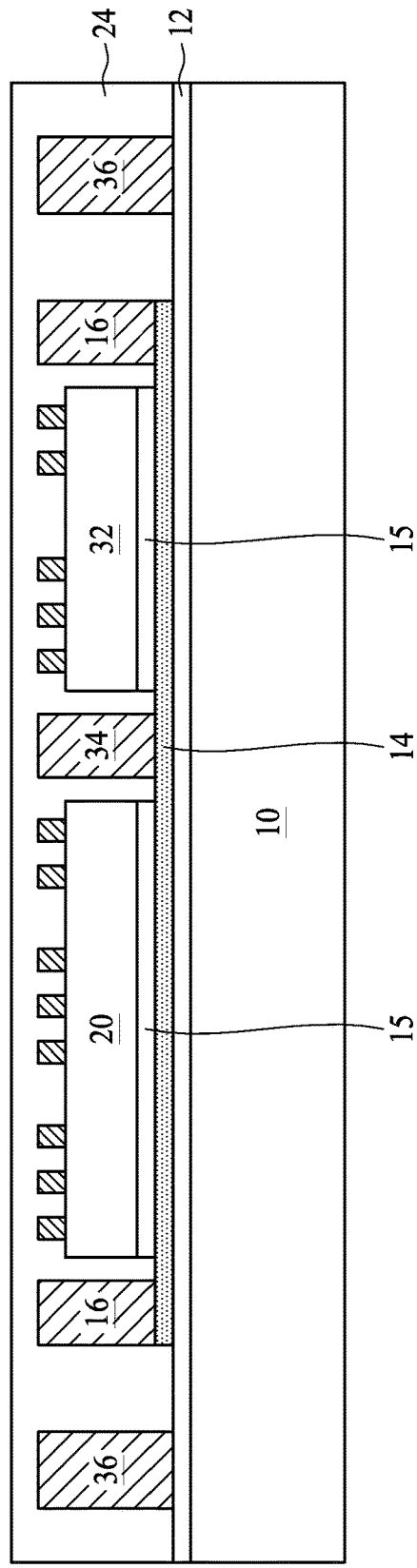
Figure 6E:
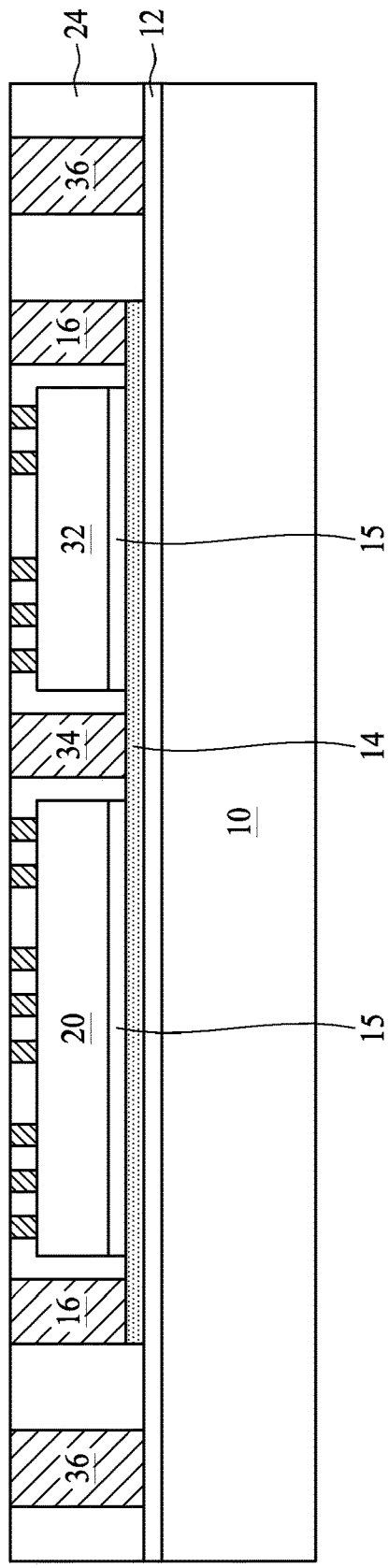

As shown in FIG. 6D, a molding layer 24 is disposed over the carrier 10 to encapsulate the shielding layer 14, the shielding element 16, the conductive post 36, the shielding compartment 34, the first electronic component 20 and the second electronic component 32. As shown in FIG. 6E, a portion of the molding layer 24 is removed to expose the shielding element 16, the shielding compartment 34 and the conductive post 36. In some embodiments, the portion of the molding layer 24 is removed by grinding. In some embodiments, the conductive pillars 22 of the first electronic component 20 and of the second electronic component 32 are exposed after grinding.

Figure 6F:
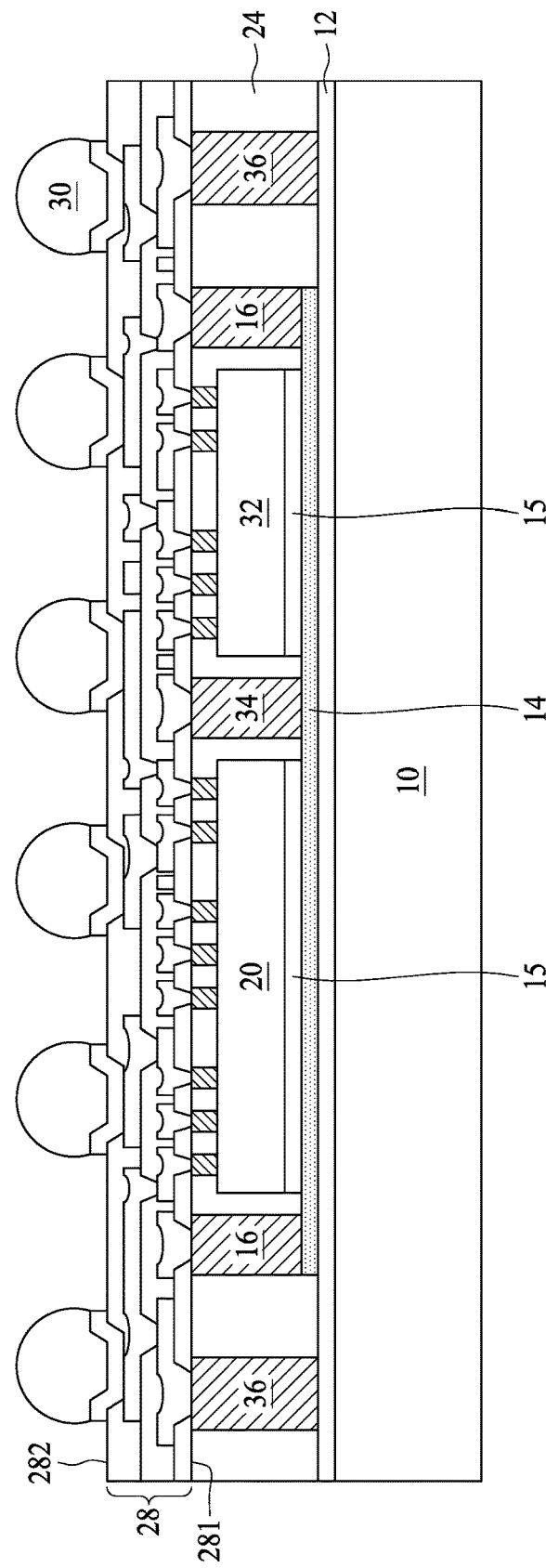

As shown in FIG. 6F, a first circuit layer 28 is formed over the molding layer 24, the shielding element 16, the conductive post 36, the shielding compartment 34, the first electronic component 20 and the second electronic component 32. In some embodiments, the first circuit layer 28 is an RDL implemented by alternately forming several conductive wiring layers and several dielectric layers. The first circuit layer 28 includes a first surface 281 facing the first electronic component 20, and a second surface 282 opposite to the first surface 281. In some embodiments, the conductive wiring layer proximal to the second surface 282 may function as or may include bonding pads such as under bump metallurgies (UBMs). Then, first conductors 30 are formed over the second surface 282 of the first circuit layer 28.

Figure 6G:
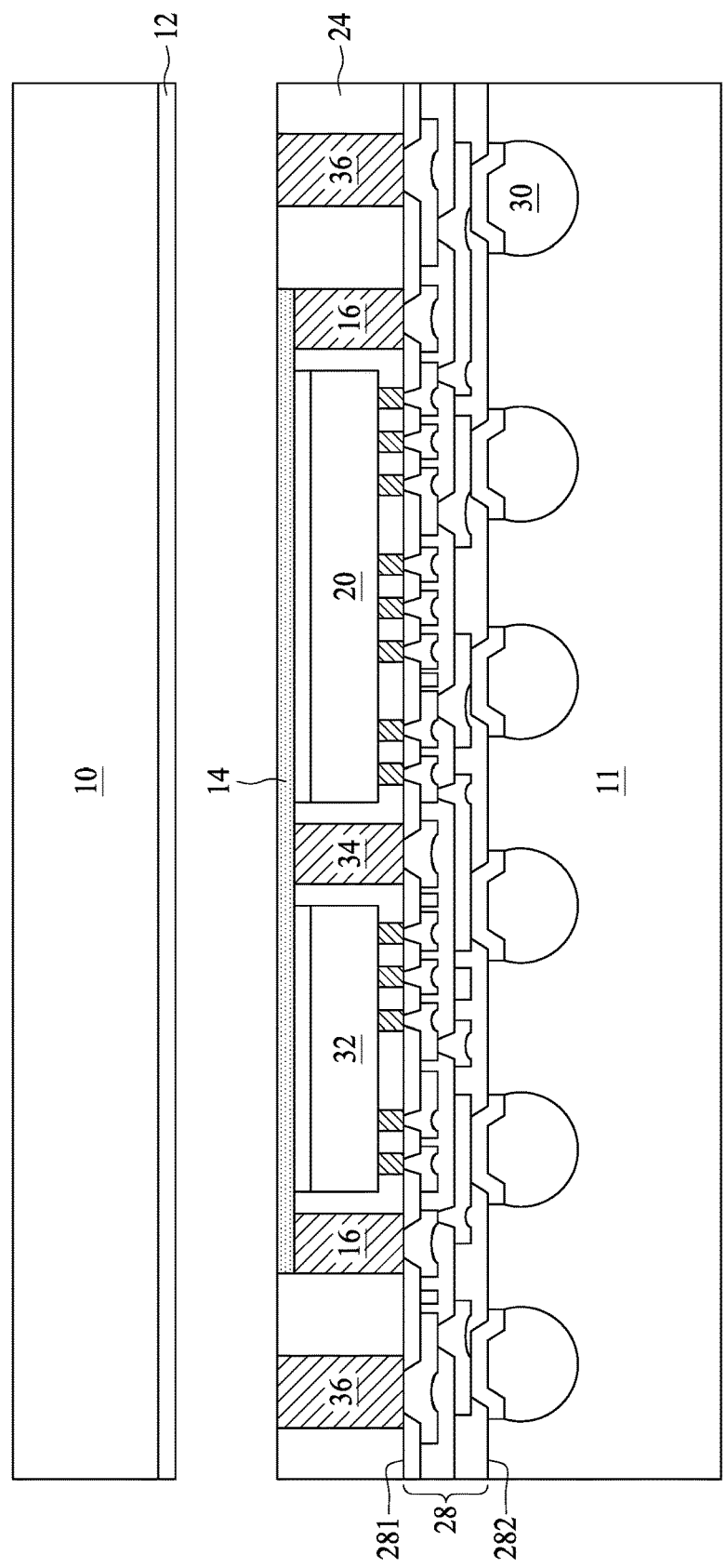

As shown in FIG. 6G, the first conductors 30 are mounted on a supporter 11, the semiconductor package may be flipped, and the carrier 10 and the conductive film 12 are removed from the shielding layer 14. In some embodiments, the supporter 11 is a tape attached to the second surface of the first circuit layer 28 and enclosing the first conductors 30. In some embodiments, residual conductive film 12 is removed from the shielding layer 14, the molding layer 24 and the at least one conductive post 36 by, for example, grinding or etching.

Figure 6H:
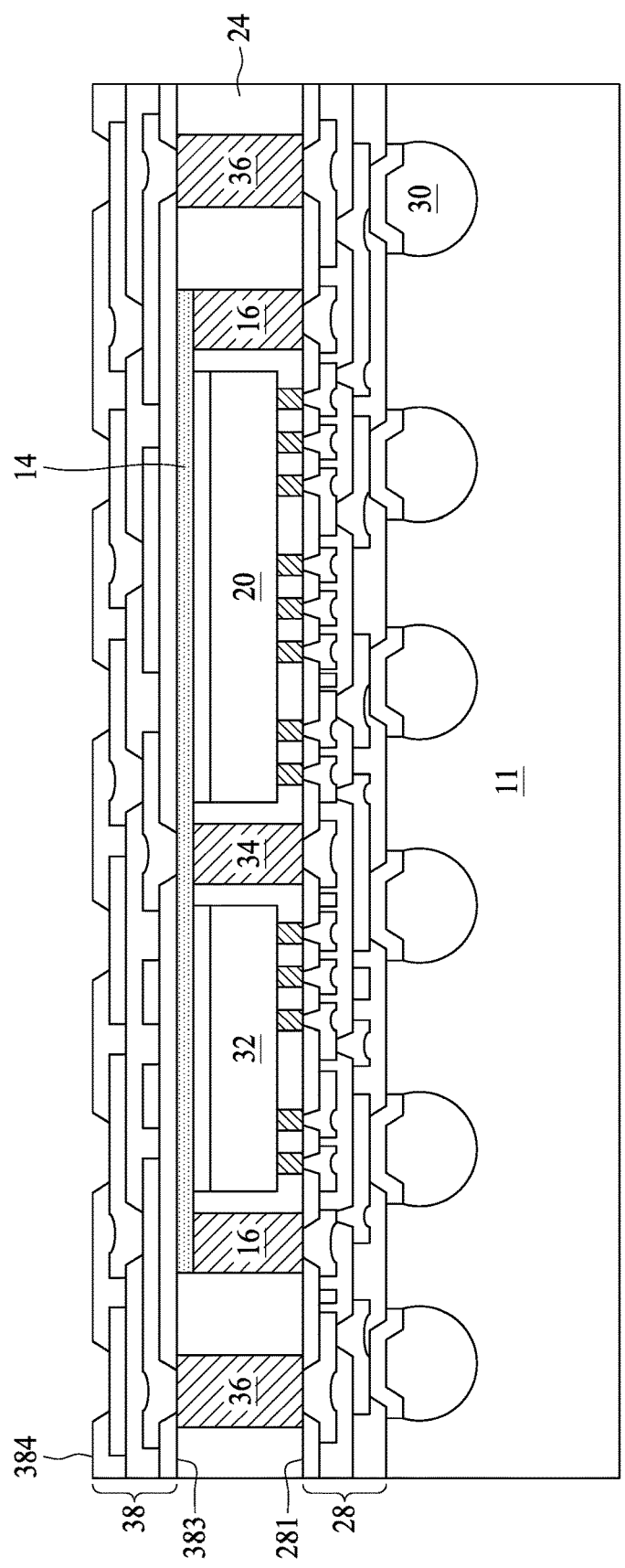

As shown in FIG. 6H, the second circuit layer 38 is formed over the shielding layer 14, the molding layer 24 and the at least one conductive post 36. The second circuit layer 38 includes a third surface 383 facing the first circuit layer 28, and a fourth surface 384 opposite to the third surface 383. The supporter 11 is then removed from the first conductors 30, and a singulation process is performed to form a semiconductor device package 4 as illustrated in FIG. 5.

Figure 7:
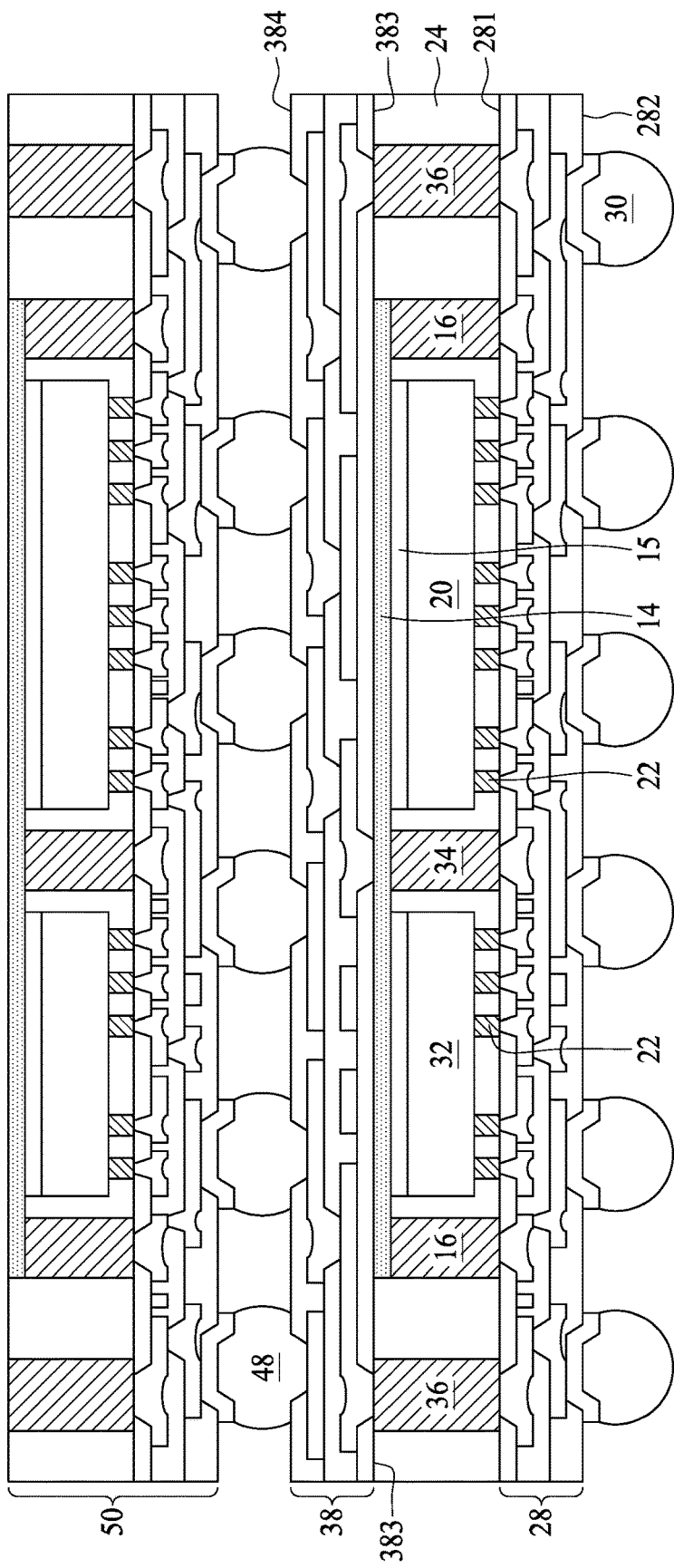
FIG. 7 is a cross-sectional view of a semiconductor device package in accordance with some embodiments of the present disclosure.

FIG. 7 is a cross-sectional view of a semiconductor device package 5 in accordance with some embodiments of the present disclosure. As shown in FIG. 7, different from the semiconductor device package 4, the semiconductor device package 5 further includes an electronic device 50 disposed over and electrically connected to the second circuit layer 38. In some embodiments, the electronic device 50 may, but need not, be another semiconductor device package having similar structure as the semiconductor device packages 3 or 4. In some embodiments, the semiconductor device package 5 further includes second conductors 48 disposed between and electrically connected to both the second circuit layer 38 and the electronic device 50. In some embodiments, the second conductors 48 include conductive bumps such as solder bumps, solder balls, solder pastes or the like. In some embodiments, at least some of the second conductors 48 are electrically connected to the first electronic component 20 and the second electronic component 32 through the second circuit layer 38, and are electrically connected to the electronic device 50. In some embodiments, at least some of the second conductors 48 and a portion of first conductors 30 are configured to connect to a grounding circuit.

Figure 8:
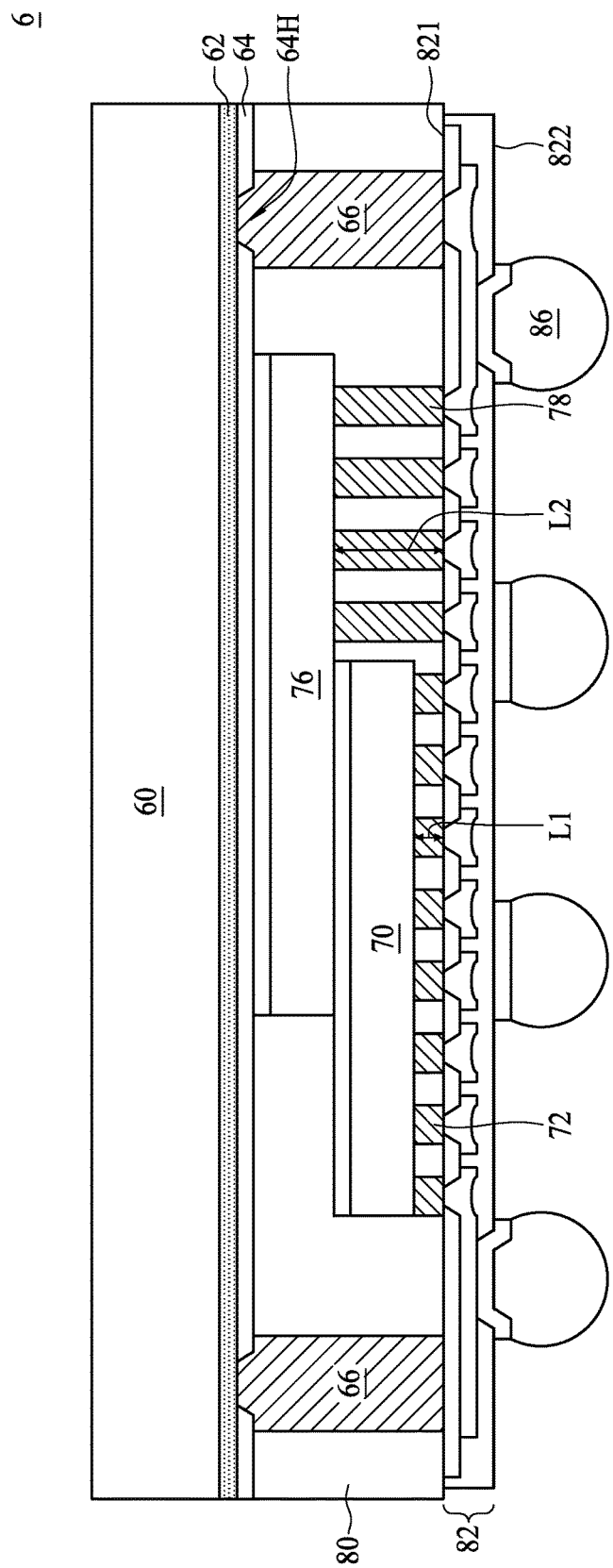
FIG. 8 is a cross-sectional view of a semiconductor device package in accordance with some embodiments of the present disclosure.

FIG. 8 is a cross-sectional view of a semiconductor device package 6 in accordance with some embodiments of the present disclosure. As shown in FIG. 8, the semiconductor device package 6 includes a circuit layer 82, a first electronic component 70, a second electronic component 76, a shielding element 66, a molding layer 80, a shielding layer 62 and a carrier 60. The first electronic component 70 is disposed over a first surface 821 of the circuit layer 82. In some embodiments, the circuit layer 82 is a redistribution layer (RDL) configured to reroute input/output paths corresponding to input/output (I/O) contacts of the first electronic component 70 and/or the second electronic component 76. The first electronic component 70 includes first conductive pillars 72 extending toward the first surface 821 and electrically connected to the circuit layer 82. The second electronic component 76 is disposed over the first surface 821 of the circuit layer 82 and at least a portion of the first electronic component 70. The second electronic component 76 includes second conductive pillars 78 extending toward the first surface 821 and electrically connected to the circuit layer 82. The second electronic component 76 partially overlaps the first electronic component 70 (e.g. a portion of the second electronic component 76 is disposed over the first electronic component 70, and another portion of the second electronic component 76 is not disposed over the first electronic component 70), and a length L2 of at least one of the second conductive pillars 78 is larger than a length L1 of at least one of the first conductive pillars 72. In some embodiments, the first electronic component 70 and the second electronic component 76 are semiconductor dies having an integrated circuit formed therein. In some embodiments, each of the first electronic component 70 and the second electronic component 76 may, but need not, include any of an active component such as an application specific IC (ASIC), a memory component such as a high bandwidth memory (HBM) component or another active component, and/or a passive component such as a capacitor, an inductor, a resistor or the like.

The shielding element 66 is disposed over the first surface 821 and is electrically connected to the circuit layer 82. The shielding element 66 is adjacent to at least one side of the first electronic component 70 and the second electronic component 76. By way of example, the shielding element 66 may be disposed adjacent one side, two sides, three sides or more sides of the first electronic component 70 and the second electronic component 76. In some embodiments, the shielding element 66 surrounds the sides of the first electronic component 70 and the second electronic component 76 and helps to reduce EMI. In some embodiments, the shielding element 66 is configured to function as a part of a grounding path. In some embodiments, the shielding element 66 is formed of conductive material such as metal or alloy. By way of example, the conductive material may include, but is not limited to, copper, copper alloy, or the like.

The molding layer 80 encapsulates the first electronic component 70, the second electronic component 76 and the shielding element 66. The shielding layer 62 is disposed over the molding layer 80 and is electrically connected to the shielding element 66. In some embodiments, the material of the molding layer 80 includes, but is not limited to, a molding compound such as an epoxy resin or the like, and fillers such as silicon oxide fillers in the molding compound. The carrier 60 is disposed over the shielding layer 62. In some embodiments, the carrier 60 is a semiconductor carrier such as a silicon carrier. In some embodiments, the carrier 60 is configured to enhance robustness and heat dissipation for the semiconductor device package 6.

In some embodiments, the semiconductor device package 6 further includes an insulating layer 64 disposed between the molding layer 80 and the shielding layer 62. The insulating layer 64 defines an opening 64H, and the shielding layer 62 and the shielding element 66 are electrically connected through the opening 64H of the insulating layer 64.

In some embodiments, the semiconductor device package 6 further includes conductors 86 disposed over a second surface 822 of the circuit layer 82 and electrically connected to the circuit layer 82. In some embodiments, the conductors 86 include conductive bumps such as solder bumps, solder balls, solder pastes or the like. In some embodiments, at least some of the conductors 86 are electrically connected to the first electronic component 70 and/or the second electronic component 76 through the circuit layer 82, and are configured to create an electrical connection path to another electronic device such as a circuit board or the like. In some embodiments, some other conductors 86 are electrically connected to the shielding element 66 through the circuit layer 82, and are configured to connect to a grounding circuit.

Figure 9A:
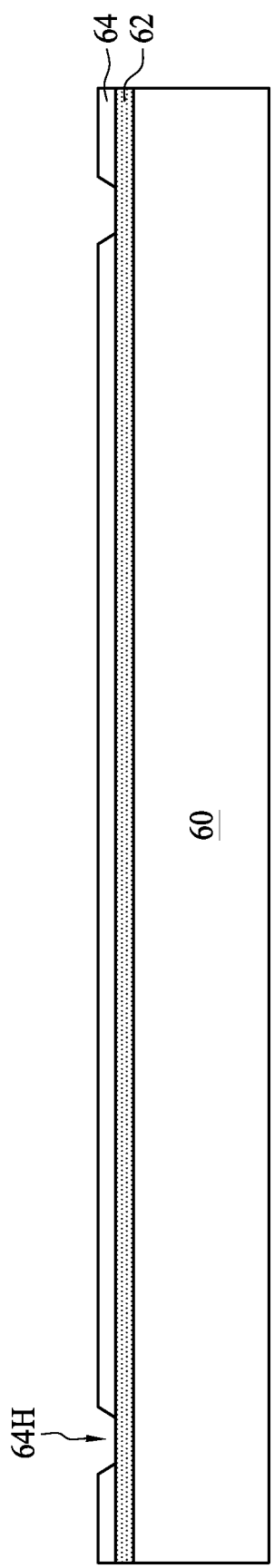
FIG. 9A, FIG. 9B, FIG. 9C, FIG. 9D, FIG. 9E and FIG. 9F illustrate an example of a manufacturing method of a semiconductor device package in accordance with some embodiments of the present disclosure.

FIG. 9A, FIG. 9B, FIG. 9C, FIG. 9D, FIG. 9E and FIG. 9F illustrate an example of a manufacturing method of the semiconductor device package 6 in accordance with some embodiments of the present disclosure. As depicted in FIG. 9A, a shielding layer 62 is formed over a carrier 60. In some embodiments, an insulating layer 64 is formed over the shielding layer 62. The insulating layer 64 defines one or more openings 64H exposing the shielding layer 62.

Figure 9B:
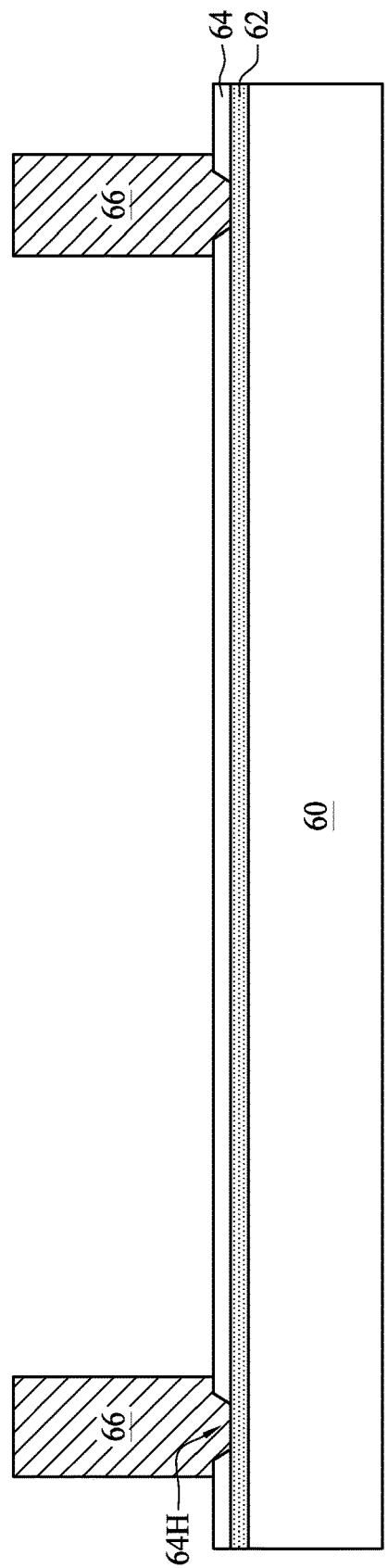
Figure 9C:
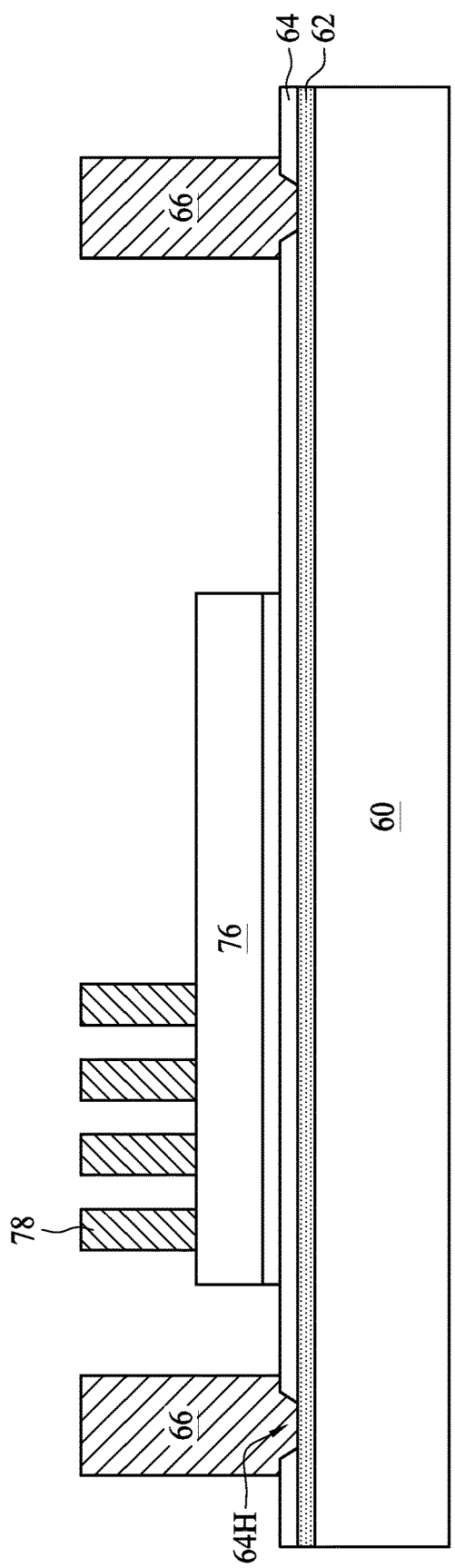

As shown in FIG. 9B, a shielding element 66 is formed over the shielding layer 64. In some embodiments, the shielding element 66 is electrically connected to the shielding layer 64 through the opening 64H of the insulating layer 64. As shown in FIG. 9C, a second electronic component 76 is bonded to the carrier 60 (e.g. via the insulating layer 64 and the shielding layer 62), adjacent to the shielding element 16. In some embodiments, the second electronic component 76 includes conductive pillars 78 such as conductive posts extending upward.

Figure 9D:
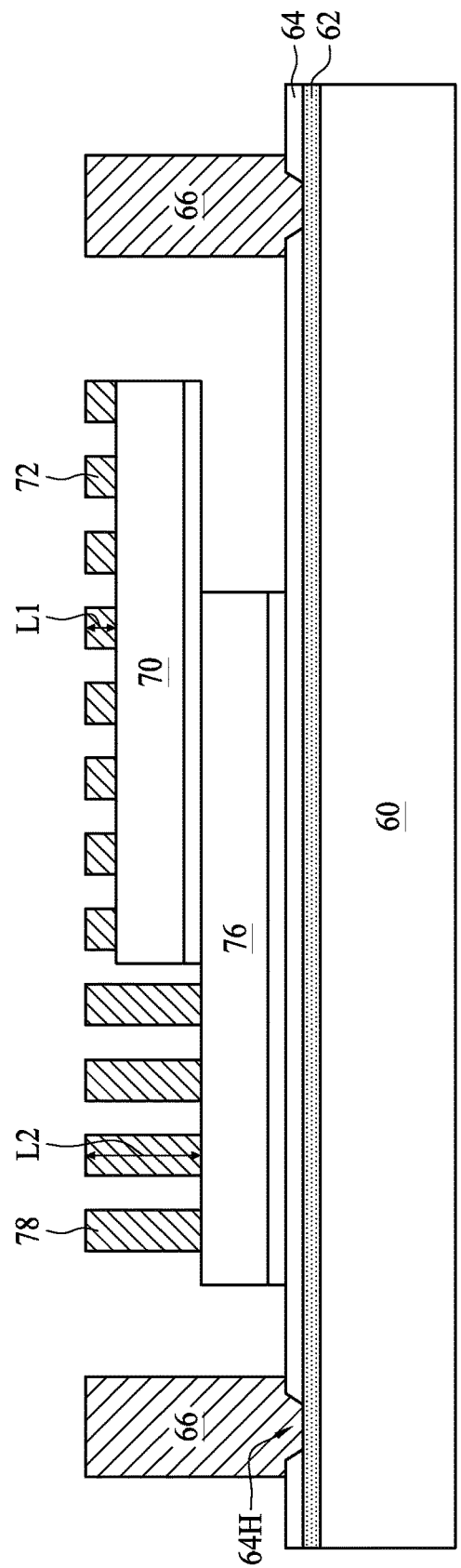

As shown in FIG. 9D, a first electronic component 70 is formed over at least a portion of the second electronic component 76. The first electronic component 70 includes a plurality of second conductive pillars 72 extending upward. The second electronic component 76 partially overlaps the first electronic component 70, and a length L2 of at least one of the second conductive pillars 78 is larger than a length L1 of at least one of the first conductive pillars 72.

Figure 9E:
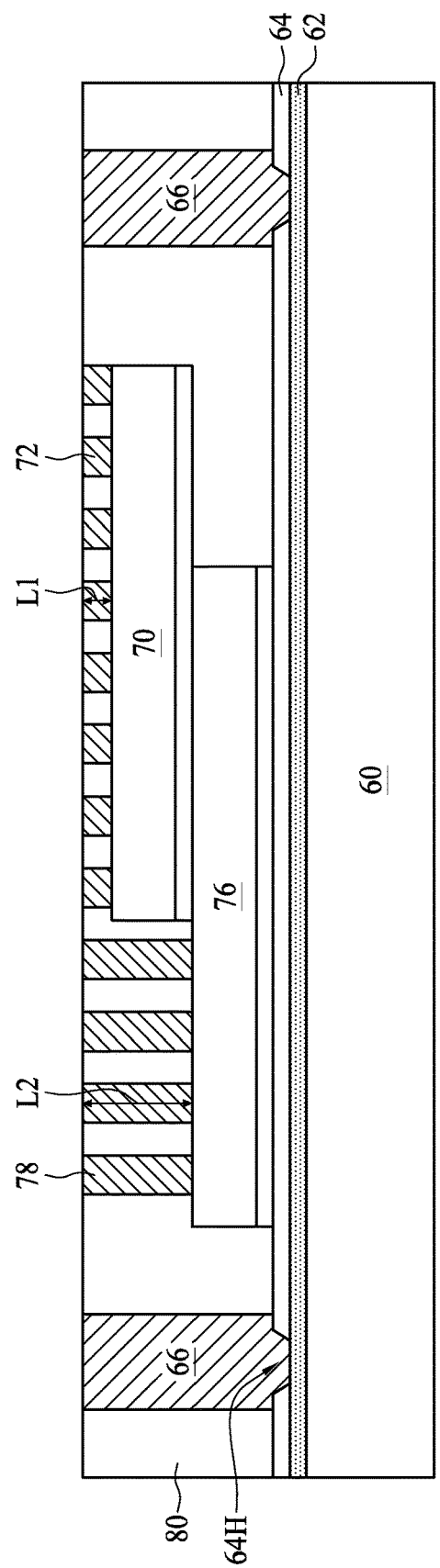

As shown in FIG. 9E, a molding layer 80 is disposed over the carrier 10 to encapsulate the shielding layer 64, the shielding element 66, the first electronic component 72 and the second electronic component 76. A portion of the molding layer 80 is removed to expose the shielding element 66. In some embodiments, the portion of the molding layer 80 is removed by grinding. In some embodiments, the conductive pillars 72 of the first electronic component 70 and the conductive pillars 78 of the second electronic component 76 are exposed after grinding.

Figure 9F:
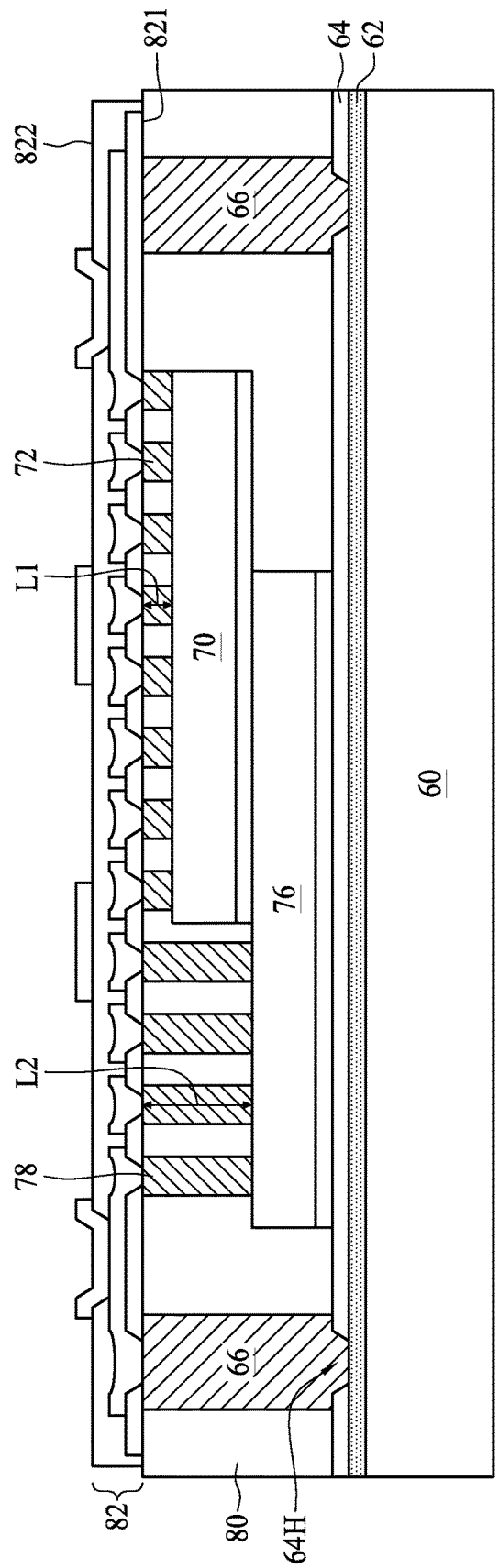

As shown in FIG. 9F, a circuit layer 82 is formed over the molding layer 80, the shielding element 66, the first electronic component 70 and the second electronic component 76. In some embodiments, the circuit layer 82 is an RDL implemented by alternately forming several conductive wiring layers and several dielectric layers. The circuit layer 82 includes a first surface 821 facing the first electronic component 70 and the second electronic component 76, and a second surface 822 opposite to the first surface 821. In some embodiments, the conductive wiring layer proximal to the second surface 822 may function as or may include bonding pads such as under bump metallurgies (UBMs). Conductors 86 are formed over the second surface 822 of the circuit layer 82 to form a semiconductor device package 6 as illustrated in FIG. 8.

A semiconductor device package of various embodiments of the present disclosure is compatible with wafer level chip scale packaging (WLCSP). The semiconductor device package is compatible with package on package structure, and 2.5 D/3D packaging. The shielding layer and the shielding element can form a conformal EMI shielding for the electronic component(s), and the conformal EMI shielding makes it possible to further reduce the size of the semiconductor device package. The shielding layer may also be configured to function as a heat sink for enhancing heat dissipation for the electronic component(s). The electronic components can partially overlap, and can be electrically connected to a circuit layer. Thus, the size of the semiconductor device package is reduced, and electrical communication is implemented in a shorter path, which increases bandwidth and speed and reduces power consumption.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first circuit layer having a first surface and a second surface opposite to the first surface;
   a first electronic component disposed over the first surface of the first circuit layer, and electrically connected to the first circuit layer;
   a shielding element disposed over the first surface of the first circuit layer, and electrically connected to the first circuit layer, wherein the shielding element is disposed adjacent to at least one side of the first electronic component;
   a shielding layer disposed over the first electronic component and over the shielding element, wherein the shielding layer is electrically connected to the shielding element;
   a molding layer encapsulating the first electronic component, the shielding element and a portion of the shielding layer, wherein an upper surface of the molding layer and an upper surface of the shielding layer are substantially coplanar;
   at least one conductive post extending through the molding layer and electrically connected to the first circuit layer;
   a second circuit layer disposed over the molding layer, the shielding layer and the at least one conductive post, and electrically connected to the shielding layer and to the at least one conductive post; and
   an electronic device disposed over and electrically connected to the second circuit layer.

2. The semiconductor device package of claim 1, wherein the shielding layer is in contact with the first electronic component.

3. The semiconductor device package of claim 2, wherein a first interface between the shielding layer and the shielding element and a second interface between the shielding layer and the first electronic component are substantially coplanar.

4. The semiconductor device package of claim 1, further comprising a thermal conductive element disposed between the first electronic component and the shielding layer.

5. The semiconductor device package of claim 4, wherein a first interface between the shielding layer and the shielding element and a second interface between the shielding layer and the thermal conductive element are substantially coplanar.

6. The semiconductor device package of claim 1, wherein the molding layer comprises a plurality of fillers, and at least some fillers adjacent to the first circuit layer have at least one cutting plane.

7. The semiconductor device package of claim 1, wherein a width of the shielding element is larger than a thickness of the shielding layer.

8. The semiconductor device package of claim 1, further comprising a plurality of first conductors disposed over the second surface of the first circuit layer, and electrically connected to the first circuit layer.

9. The semiconductor device package of claim 1, wherein the shielding element surrounds all sides of the first electronic component.

10. The semiconductor device package of claim 1, further comprising:
- a second electronic component disposed over the first surface of the first circuit layer, and electrically connected to the first circuit layer; and
- a shielding compartment disposed over the first surface of the first circuit layer and disposed between the first electronic component and the second electronic component, wherein the shielding compartment is electrically connected to the first circuit layer and the shielding layer.

11. The semiconductor device package of claim 1, further comprising a plurality of second conductors disposed between and electrically connected to the second circuit layer and the electronic device.

12. A semiconductor device package, comprising:
- a circuit layer having a first surface and a second surface opposite to the first surface;
- a first electronic component disposed over the first surface of the circuit layer, and electrically connected to the circuit layer;
- a shielding element disposed over the first surface of the circuit layer, and electrically connected to the circuit layer;
- a shielding layer disposed over the first electronic component and over the shielding element, wherein the shielding layer is electrically connected to the shielding element;
- a molding layer encapsulating the first electronic component and the shielding element, wherein an upper surface of the molding layer and an upper surface of the shielding layer are substantially coplanar;
- a second electronic component disposed over the first surface of the circuit layer, and electrically connected to the circuit layer; and
- a shielding compartment disposed over the first surface of the circuit layer and disposed between the first electronic component and the second electronic component, wherein the shielding compartment is electrically connected to the circuit layer and the shielding layer.

13. The semiconductor device package of claim 12, wherein the shielding layer is in contact with the first electronic component.

14. The semiconductor device package of claim 13, wherein a first interface between the shielding layer and the shielding element and a second interface between the shielding layer and the first electronic component are substantially coplanar.

15. The semiconductor device package of claim 12, further comprising a thermal conductive element disposed between the first electronic component and the shielding layer.

16. The semiconductor device package of claim 15, wherein a first interface between the shielding layer and the shielding element and a second interface between the shielding layer and the thermal conductive element are substantially coplanar.

17. A semiconductor device package, comprising:
- a circuit layer having a first surface and a second surface opposite to the first surface, wherein the first surface and the second surface of the circuit layer are substantially parallel to each other;
- an electronic component disposed over the first surface of the circuit layer, and electrically connected to the circuit layer;
- a shielding layer disposed over the electronic component; and
- a molding layer encapsulating the electronic component, wherein the molding layer comprises a plurality of fillers, and at least some fillers adjacent to the circuit layer respectively have one or more cutting planes, the one or more cutting planes disposed along the first surface of the circuit layer.

18. The semiconductor device package of claim 17, further comprising a shielding element disposed over the first surface of the circuit layer, and electrically connected to the circuit layer.

19. The semiconductor device package of claim 17, wherein the electronic component has a bottom surface facing the first surface of the circuit layer, and the one or more cutting planes are substantially parallel to the bottom surface of the electronic component.

20. A semiconductor device package, comprising:
- a first circuit layer having a first surface and a second surface opposite to the first surface;
- a first electronic component disposed over the first surface of the first circuit layer, and electrically connected to the first circuit layer;
- a shielding element disposed over the first surface of the first circuit layer, and electrically connected to the first circuit layer, wherein the shielding element surrounds four sides of the first electronic component;
- a shielding layer disposed over the first electronic component and over the shielding element, wherein the shielding layer is electrically connected to the shielding element; and
- a molding layer encapsulating the first electronic component, the shielding element and a portion of the shielding layer, and disposed between the first electronic component and the first surface of the first circuit layer, wherein an upper surface of the molding layer and an upper surface of the shielding layer are substantially coplanar.

21. The semiconductor device package of claim 20, wherein a bottom surface of the shielding layer, an upper surface of the first electronic component and an upper surface of the shielding element are substantially coplanar.

* * * * *